United States Patent
Hsu et al.

(10) Patent No.: US 12,339,579 B2
(45) Date of Patent: Jun. 24, 2025

(54) METHOD OF CRITICAL DIMENSION CONTROL BY OXYGEN AND NITROGEN PLASMA TREATMENT IN EUV MASK

(71) Applicant: Taiwan Semiconductor Manufacturing Co., Ltd., Hsin-Chu (TW)

(72) Inventors: Pei-Cheng Hsu, Taipei (TW); Chun-Fu Yang, Hsinchu (TW); Ta-Cheng Lien, Hsinchu County (TW); Hsin-Chang Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/635,209

(22) Filed: Apr. 15, 2024

(65) Prior Publication Data

US 2024/0264520 A1    Aug. 8, 2024

Related U.S. Application Data

(63) Continuation of application No. 18/317,368, filed on May 15, 2023, now Pat. No. 11,960,201, which is a continuation of application No. 17/568,037, filed on Jan. 4, 2022, now Pat. No. 11,650,493, which is a continuation of application No. 16/776,046, filed on Jan. 29, 2020, now Pat. No. 11,215,918.

(60) Provisional application No. 62/880,340, filed on Jul. 30, 2019.

(51) Int. Cl.
G03F 1/24     (2012.01)
G03F 1/70     (2012.01)
G03F 7/20     (2006.01)

(52) U.S. Cl.
CPC .......... *G03F 1/24* (2013.01); *G03F 1/70* (2013.01); *G03F 7/2004* (2013.01)

(58) Field of Classification Search
CPC .......... G03F 1/24; G03F 1/70; G03F 7/2004
USPC ................................................. 430/5
See application file for complete search history.

(56) References Cited

U.S. PATENT DOCUMENTS

| | | |
|---|---|---|
| 8,796,666 B1 | 8/2014 | Huang et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,869,934 B2 | 1/2018 | Huang et al. |
| 9,869,939 B2 | 1/2018 | Yu et al. |
| 2015/0268565 A1 | 9/2015 | Yu |
| 2016/0329210 A1 | 11/2016 | Mao et al. |
| 2019/0146336 A1 | 5/2019 | Chen |
| 2019/0324364 A1 | 10/2019 | Hsu et al. |
| 2021/0033960 A1 | 2/2021 | Hsu et al. |
| 2022/0121103 A1 | 4/2022 | Hsu et al. |

FOREIGN PATENT DOCUMENTS

| | | |
|---|---|---|
| CN | 1916767 A | 2/2007 |
| CN | 101281361 A | 10/2008 |
| TW | 409315 B | 10/2000 |
| TW | 559889 B | 11/2003 |
| TW | 200536017 A | 11/2005 |
| TW | 200631127 A | 9/2006 |
| TW | 200809921 A | 2/2008 |
| TW | 201123264 A | 7/2011 |
| TW | 201344371 A | 11/2013 |
| TW | 201621983 A | 6/2016 |
| TW | 201923834 A | 6/2019 |
| TW | 201929087 A | 7/2019 |

*Primary Examiner* — Christopher G Young
(74) *Attorney, Agent, or Firm* — HAYNES AND BOONE, LLP

(57) ABSTRACT

The present disclosure describes a method of patterning a semiconductor wafer using extreme ultraviolet lithography (EUVL). The method includes receiving an EUVL mask that includes a substrate having a low temperature expansion material, a reflective multilayer over the substrate, a capping layer over the reflective multilayer, and an absorber layer over the capping layer. The method further includes patterning the absorber layer to form a trench on the EUVL mask, wherein the trench has a first width above a target width. The method further includes treating the EUVL mask with oxygen plasma to reduce the trench to a second width, wherein the second width is below the target width. The method may also include treating the EUVL mask with nitrogen plasma to protect the capping layer, wherein the treating of the EUVL mask with the nitrogen plasma expands the trench to a third width at the target width.

20 Claims, 17 Drawing Sheets

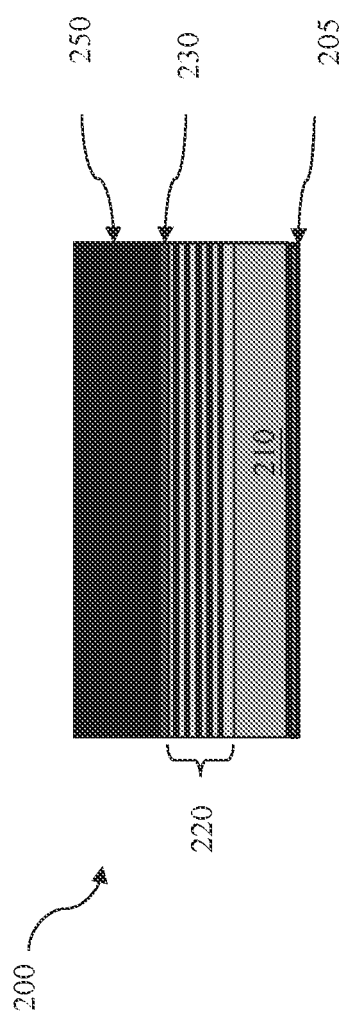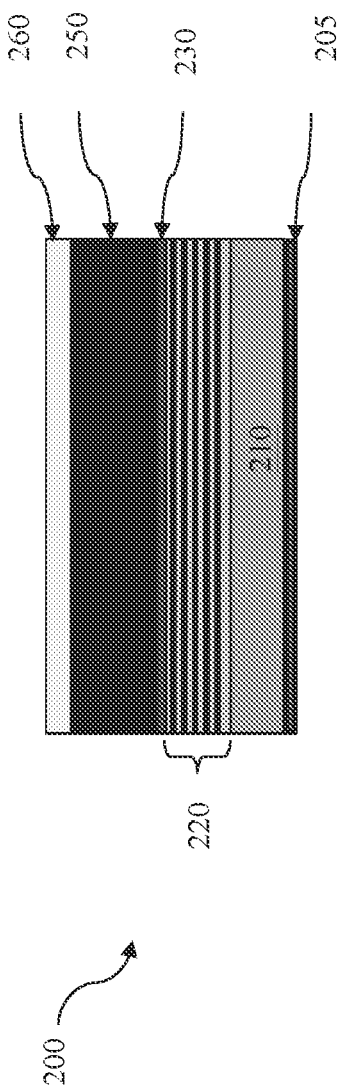
FIG. 3A
FIG. 3B

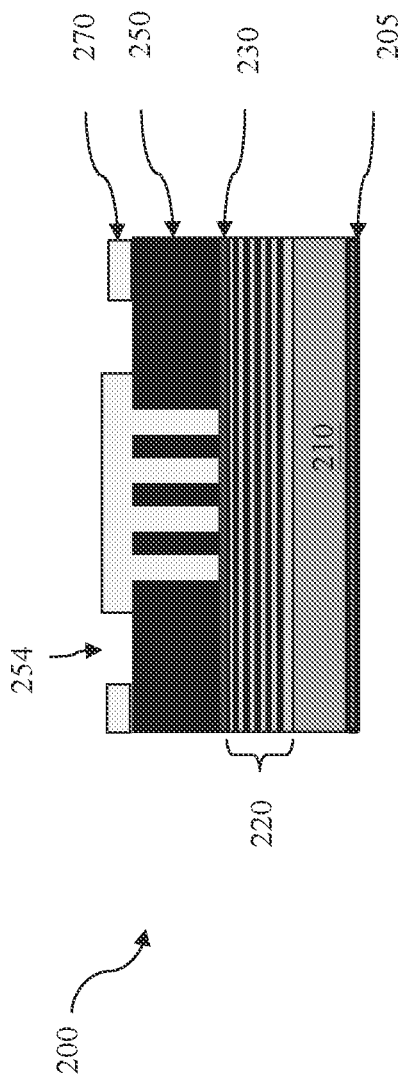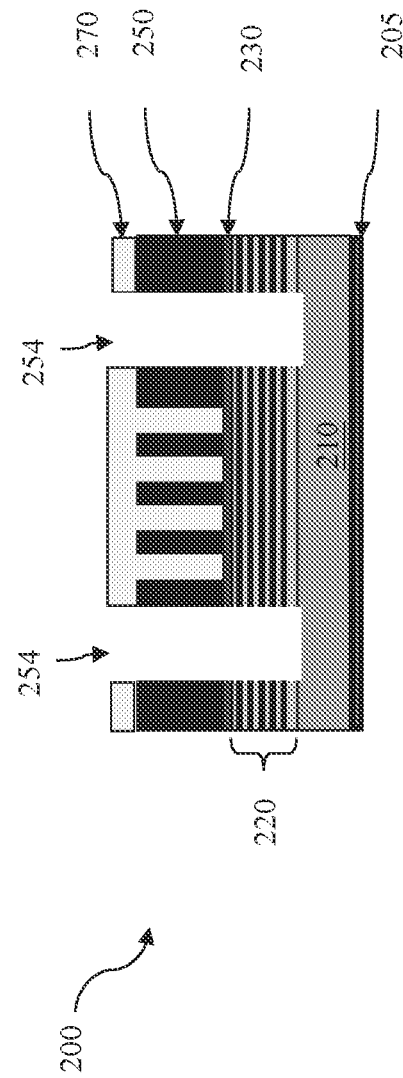
FIG. 4E
FIG. 4F

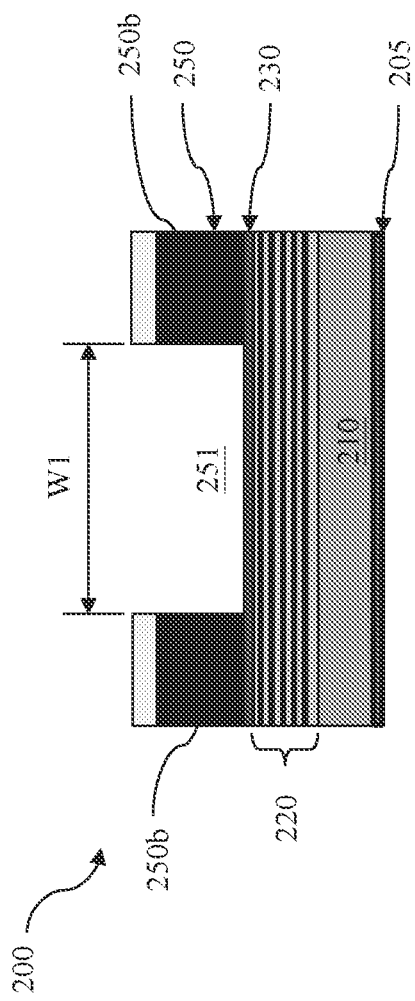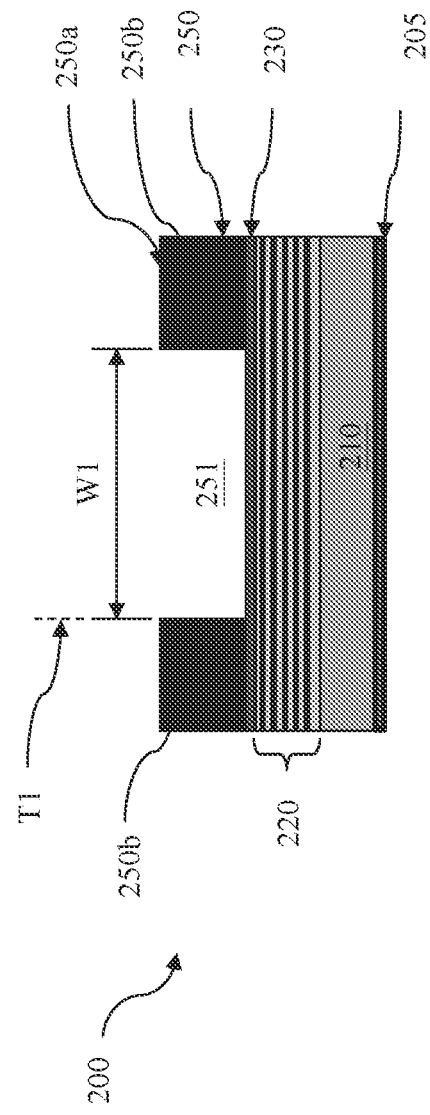

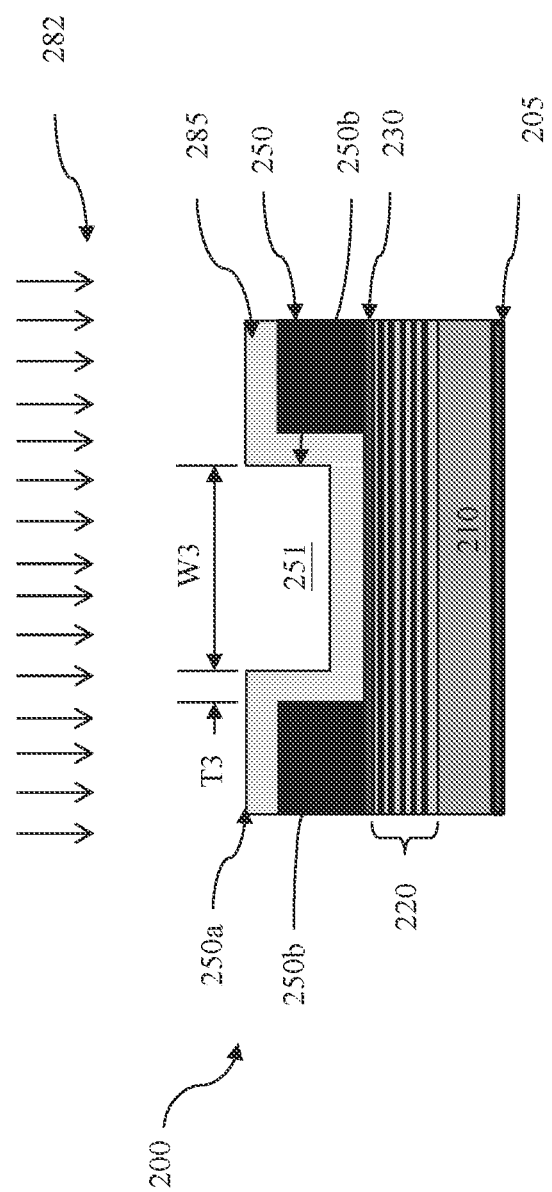

METHOD OF CRITICAL DIMENSION CONTROL BY OXYGEN AND NITROGEN PLASMA TREATMENT IN EUV MASK

PRIORITY DATA

The present application is a continuation of U.S. Non-Provisional Patent application Ser. No. 18/317,368, filed on May 15, 2023, which is a continuation of U.S. Non-Provisional patent application Ser. No. 17/568,037, filed on Jan. 4, 2022, which is a continuation of U.S. Non-Provisional patent application Ser. No. 16/776,046, filed on Jan. 29, 2020, which claims the benefit of U.S. Provisional Application No. 62/880,340 filed Jul. 30, 2019, each of which is herein incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, extreme ultraviolet (EUV) lithography has been utilized to support critical dimension (CD) requirements of smaller devices. EUV lithography employs scanners using radiation in the EUV region, having a wavelength of about 1-100 nm. Some EUV scanners provide 4× reduction projection printing, similar to some optical scanners, except that the EUV scanners use reflective rather than refractive optics, e.g., mirrors instead of lenses. Masks used in EUV lithography (also referred to as EUV lithography masks or EUVL masks) present new challenges. For example, EUVL masks typically include a patterned absorber layer over a reflective multilayer where the patterned absorber layer provides patterns for exposing wafers. The absorber layer may exhibit high Van der Waals forces, resulting from a high number of metal atoms, that cause adsorption of debris particles on a surface thereof. The patterned absorber layer may have an etch bias of only 2-3 nm. Furthermore, EUVL masks have a narrow critical dimension specification at the lower nodes increasing a risk of fabricating the EUVL mask out of specification leading to scrap. In addition, the EUVL mask may have hydrophobic surface properties that hinder particle removal during cleaning. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, and 3F illustrate cross-sectional views of an embodiment of an EUVL mask during various stages of fabrication according to various aspects of the present disclosure.

FIGS. 4A, 4B, 4C, 4D, 4E, 4F, 4G, 4H, and 4I illustrate cross-sectional views of an embodiment of an EUVL mask during various stages of fabrication according to various aspects of the present disclosure.

FIGS. 6A, 6B, 6C, 6D, 6E, 6F, and 6G illustrate cross-sectional views of an embodiment of an EUVL mask during various stages of fabrication according to various aspects of the present disclosure.

DETAILED DESCRIPTION

Figure 1A:
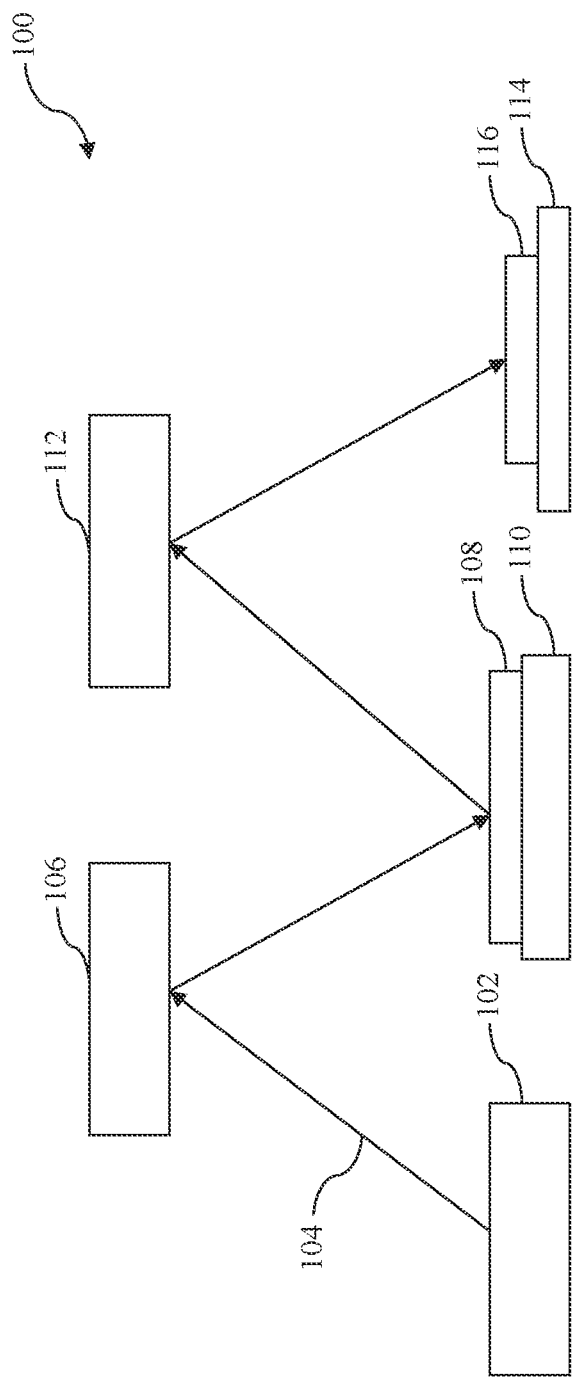
FIG. 1A is a diagram of an extreme ultraviolet (EUV) lithography exposing system that employs an EUVL mask created with embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

This application is related to the following: Ser. No. 15/956,189, filing date Apr. 18, 2018, which is assigned to a common assignee and herein incorporated by reference in its entirety.

The present disclosure is generally related to semiconductor device fabrication systems and methods, and more particularly related to making, using, and handling extreme ultraviolet lithography (EUVL) masks. EUVL processes have been utilized to achieve increasing functional densities and decreasing feature sizes in integrated circuits. EUVL masks are an important element in the EUVL processes. In the fabrication of EUVL masks, control of CD may be difficult, and particle removal during cleaning may be hindered due to a hydrophobic surface on the EUVL mask. The present disclosure provides embodiments of methods that address these issues.

FIG. 1A shows an exemplary EUV lithography system 100 that benefits from one or more embodiments of the present disclosure. The system 100 includes a radiation source 102 that produces a radiation beam 104, condenser optics 106, an EUVL mask 108 on a mask stage 110, projection optics 112, and a substrate 116 on a substrate stage 114. Other configurations and inclusion or omission of items may be possible. In the present disclosure, the system 100 may be a stepper or a scanner. The elements of the system 100 are further described below.

The radiation source 102 provides the radiation beam 104 having a wavelength in the EUV range, such as about 1-100 nm. In an embodiment, the radiation beam 104 has a wavelength of about 13.5 nm. The condenser optics 106 includes a multilayer coated collector and a plurality of grazing mirrors. The condenser optics 106 is configured to collect and shape the radiation beam 104 and to provide a slit of the radiation beam 104 to the EUVL mask 108.

The EUVL mask 108, also referred to as a photomask or a reticle, includes patterns of one or more target IC devices. The mask 108 provides a patterned aerial image to the radiation beam 104. In the present embodiment, the mask 108 is a reflective mask which will be described in further detail below with reference to FIGS. 1B-1C. Particularly, the EUVL mask 108 may be fabricated to control a CD and/or surface properties thereof. This enhances the accuracy of the pattern transfer by the EUV lithography system 100 and increases the reusability of the EUVL mask 108. The EUVL mask 108 may incorporate resolution enhancement techniques such as phase-shifting mask (PSM) and/or optical proximity correction (OPC). The mask stage 110 secures the EUVL mask 108 thereon, such as by vacuum, and provides accurate position and movement of the EUVL mask 108 during alignment, focus, leveling and exposure operation in the EUV lithography system 100.

The projection optics 112 includes one or more lens and a plurality of mirrors. The lens may have a magnification of less than one thereby reducing the patterned aerial image of the EUVL mask 108 to the substrate 116.

The substrate 116 includes a semiconductor wafer with a photoresist (or resist) layer, which is sensitive to the radiation beam 104. The substrate 116 is secured by the substrate stage 114 which provides accurate position and movement of the substrate 116 during alignment, focus, leveling and exposing operation in the EUV lithography system 100 such that the patterned aerial image of the EUVL mask 108 is exposed onto the substrate 116 in a repetitive fashion (though other lithography methods are possible).

After the substrate 116 is exposed to the radiation beam 104, it is moved to a developer where areas of the photoresist layer of the substrate 116 are removed based on whether the area is exposed to the radiation beam 104, thereby transferring the patterns from the mask 108 to the substrate 116. In some embodiments, a developer includes a water-based developer, such as tetramethylammonium hydroxide (TMAH). In other embodiments, a developer may include an organic solvent or a mixture of organic solvents, such as methyl a-amyl ketone (MAK) or a mixture involving the MAK. Applying a developer includes spraying a developer on the exposed resist film, for example, by a spin-on process. The lithography process may also include a post exposure bake (PEB) process, a post-develop bake (PDB) process, or a combination thereof. The developed or patterned photoresist layer is used for further processing the substrate 116 in order to form the target IC device. For example, one or more layers of the substrate 116 may be etched with the patterned photoresist layer as an etch mask.

Figure 1B:
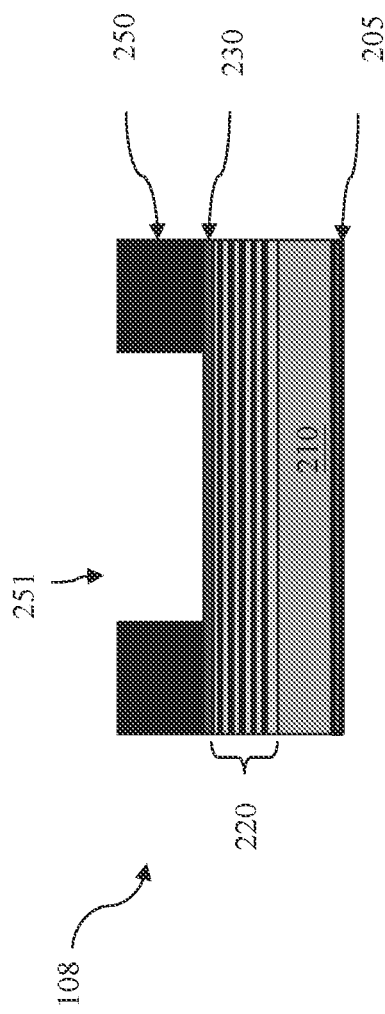
FIG. 1B illustrates a cross-sectional view of an EUVL mask, in accordance with an embodiment.
Figure 1C:
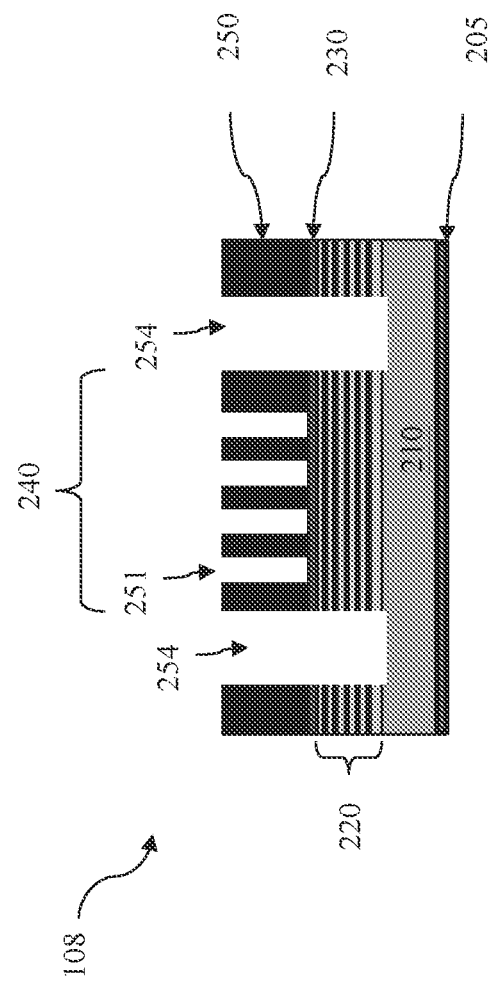
FIG. 1C illustrates a cross-sectional view of an EUVL mask, in accordance with an embodiment.

Referring to FIGS. 1B-1C, shown therein are cross-sectional views of embodiments of the EUVL mask 108, in portion, constructed and treated according to embodiments of the present disclosure. The EUVL mask 108 includes a substrate 210, a reflective multilayer (ML) 220 deposited over the substrate 210, a capping layer 230 deposited over the reflective ML 220, an absorber layer 250 deposited over the capping layer 230, and a conductive layer 205 under the substrate 210 for electrostatic chucking purposes. In an embodiment, the EUVL mask 108 may further include a protection layer (not shown) deposited over the absorber layer 250. Other configurations and inclusion or omission of various items in the EUVL mask substrate 108 may be possible.

In an embodiment, the conductive layer 205 includes chromium nitride (CrN), chromium oxynitride (CrON), or a combination thereof. In another embodiment, the conductive layer 205 includes a tantalum boride such as TaB. The substrate 210 includes low thermal expansion material (LTEM), serving to minimize image distortion due to mask heating by intensified EUV radiation. In one embodiment, the LTEM includes silicon oxide-titanium oxide alloy ($TiO_2$—$SiO_2$). In various embodiments, the LTEM may include silicon oxide-titanium oxide alloy, fused silica, fused quartz, calcium fluoride ($CaF_2$), silicon carbide, and/or other suitable LTEM.

The reflective multilayer (ML) 220 includes a plurality of film pairs, such as molybdenum-silicon (Mo/Si) film pairs (e.g., a layer of molybdenum above or below a layer of silicon in each film pair). Alternatively, the ML 220 may include molybdenum-beryllium (Mo/Be) film pairs, or any two materials or two material combinations with large difference in refractive indices and small extinction coefficients. The thickness of each layer of the ML 220 depends on the wavelength and an incident angle of the EUV radiation 104 (FIG. 1A). For a specified incident angle, the thickness of each layer of the ML 220 may be adjusted to achieve maximal constructive interference for radiations reflected at different interfaces of the ML 220. A typical number of film pairs are 20-80, however any number of film pairs are possible. In an embodiment, the ML 220 includes 40 pairs of layers of Mo/Si. Each Mo/Si film pair has a thickness of about 7 nm, e.g., about 3 nm for Mo and about 4 nm for Si. In this case, a reflectivity of about 70% is achieved.

The capping layer 230 is selected to have different etching characteristics from the absorber layer 250 and acts as an etching stop layer in a patterning or repairing process of the absorber layer 250. In the present embodiment, the capping layer 230 includes ruthenium (Ru) or Ru compounds such as ruthenium boron (RuB), ruthenium silicon (RuSi), ruthenium nitride (RuN) ruthenium oxide (RuO2), or ruthenium niobium oxide (RuNbO). The absorber layer 250 includes a material that absorbs the EUV radiation beam 104 projected thereon. The absorber layer 250 may include a single layer or multiple layers of materials selected from tantalum boron nitride (TaBN), aluminum oxide (AlO), chromium (Cr), chromium oxide (CrO), chromium nitride (CrN) titanium nitride (TiN), tantalum nitride (TaN), tantalum (Ta), titanium (Ti), aluminum-copper (Al—Cu), nickel (Ni), hafnium (Hf), hafnium oxide (HfO2), palladium, molybdenum (Mo), or other suitable high k (extinction coefficient) materials. In some embodiments, the absorber layer 250 includes a layer of tantalum boron oxide (TaBO) (e.g., 2 nm to 20 nm thick) as an anti-reflective layer over a layer of tantalum boron nitride (TaBN).

One or more of the layers 205, 220, 230, and 250 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods.

Referring to FIG. 1B, the layer 250 is patterned with one or more photolithography processes (to be discussed later) to form a trench 251.

Referring to FIG. 1C, the layers 220, 230, and 250 are patterned with one or more photolithography processes (to be discussed later) to form trenches 251 and 254. Particularly, the trenches 251 are located in a circuit pattern area 240, and the trenches 254 are located in a die boundary area that surrounds the circuit pattern area 240.

Figure 2A:
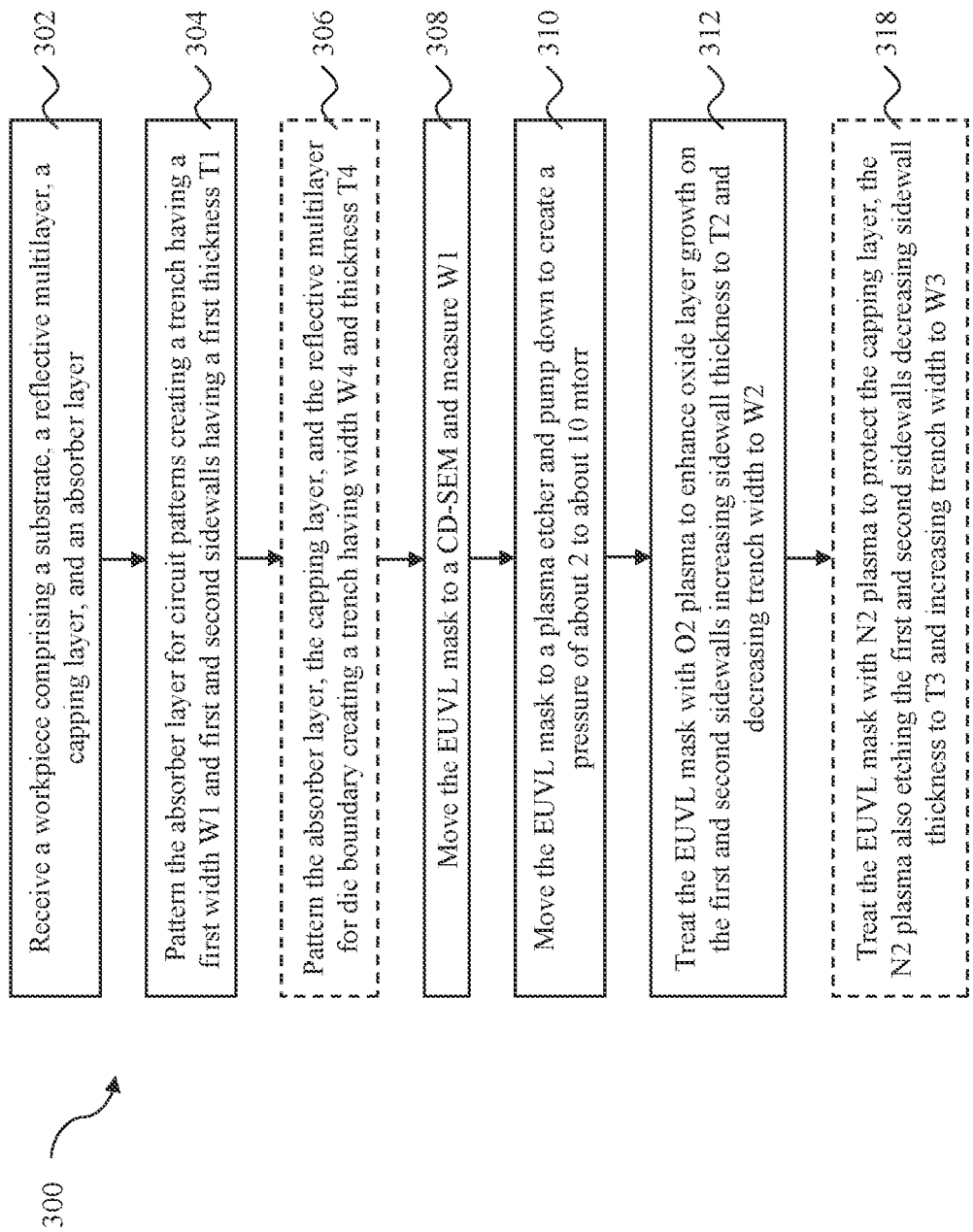
FIGS. 2A and 2B show a flowchart of a method of making EUVL masks according to various aspects of the present disclosure.
Figure 2B:
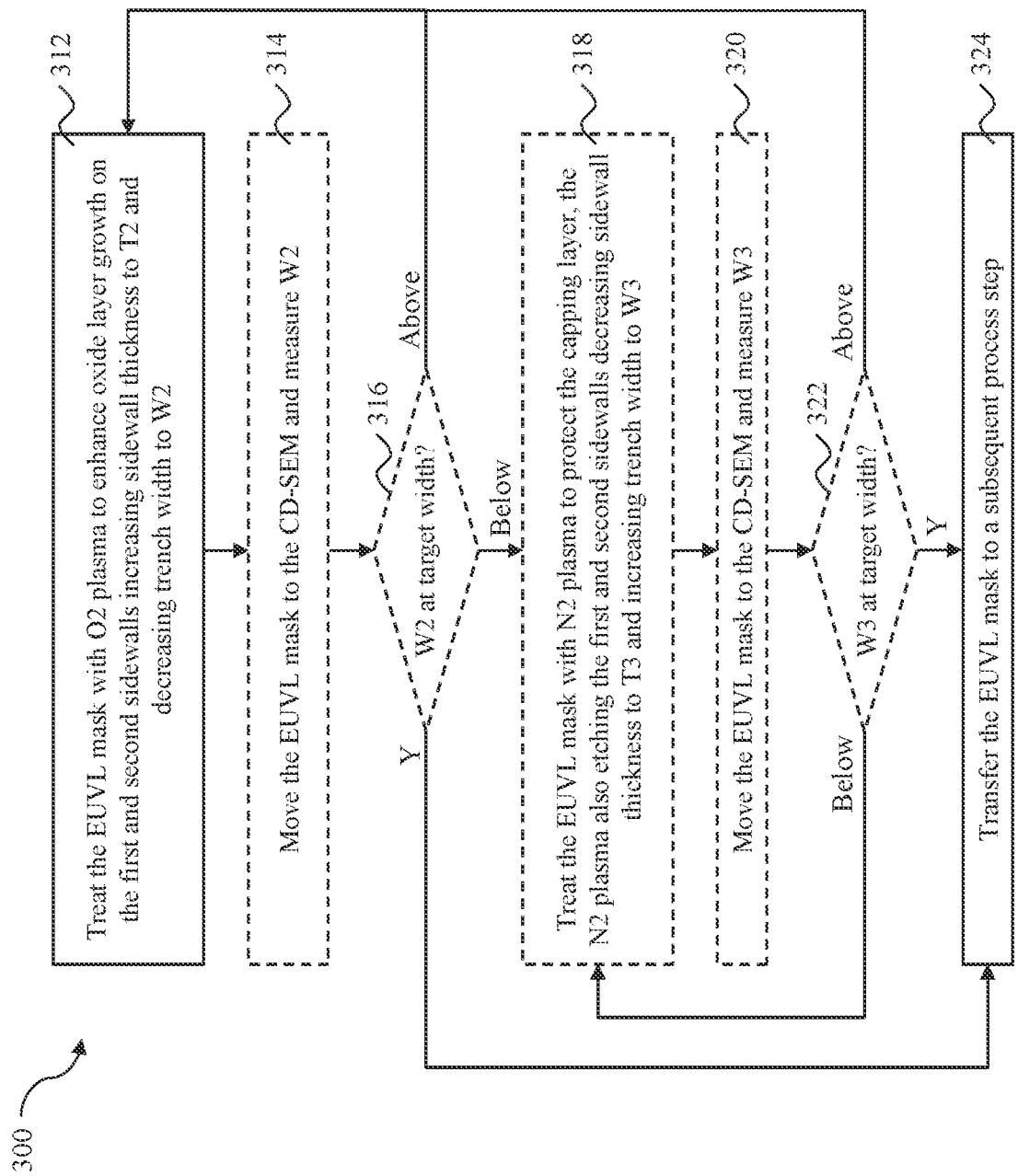

FIGS. 2A-2B show a flow chart of a method 300 of making an EUVL mask, such as the EUVL mask 108 or the EUVL mask 200, according to various aspects of the present disclosure. The method 300 is merely an example and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 3A-3F, which show cross-sectional views of the EUVL mask 200 in various stages of a manufacturing process, in accordance with various embodiments.

At operation 302, the method 300 (FIG. 2A) receives a workpiece 200 such as shown in FIG. 3A. Referring to FIG. 3A, the workpiece 200 includes a substrate 210 and various layers 205, 220, 230, and 250 formed on surfaces of the substrate 210. Particularly, the layer 205 is deposited on a surface of the substrate 210 opposite another surface of the substrate 210 where the layers 220, 230, and 250 are deposited. The materials for the substrate 210 and the layers 205, 220, 230, and 250 have been discussed with reference to FIGS. 1B-1C. Particularly, the layer 205 is a conductive layer and may include CrN or TaB, the layer 210 is an LTEM substrate, the layer 220 is a reflective multilayer, the layer 230 is a capping layer and may include ruthenium or ruthenium nitride, and the layer 250 is an absorber layer and may include tantalum boron nitride.

At operation 304, the method 300 (FIG. 2A) patterns the absorber layer 250 to produce circuit patterns thereon. This includes a variety of processes including coating a photoresist layer over the absorber layer 250, exposing the photoresist layer, developing the photoresist layer to form photoresist patterns, etching the absorber layer 250 using the photoresist patterns as an etch mask, and removing the photoresist patterns. The details of the operation 304 are further illustrated in FIG. 3B-3D.

Referring to FIG. 3B, a photoresist layer 260 is formed over the absorber layer 250, for example, by a spin coating process. The photoresist layer 260 is sensitive to electron beams in the present embodiment. The photoresist layer 260 may be a positive photoresist or a negative photoresist and may be coated to any suitable thickness.

Figure 3C:
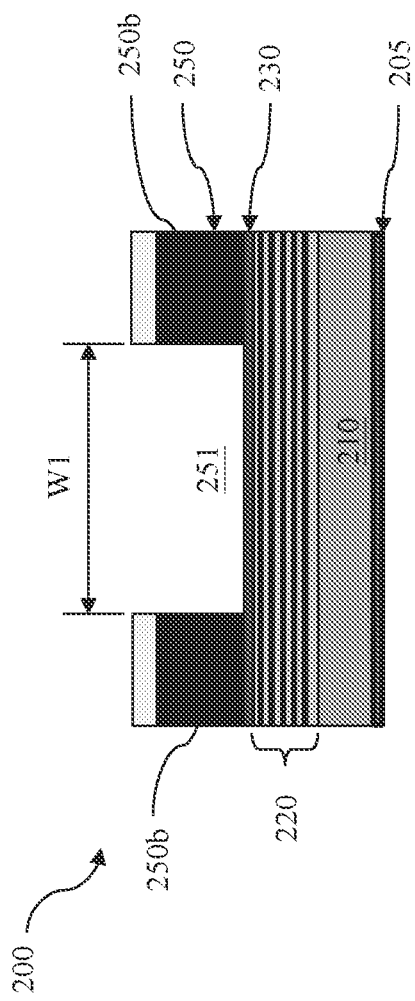

Referring to FIG. 3C, the photoresist layer 260 is exposed to a patterned electron beam and is subsequently developed to form a trench 251. The trench 251 has a first width W1, which corresponds to a first CD. The exposed photoresist layer 260 may be developed by a development process. After the photoresist layer 260 has been developed to form resist patterns, the absorber layer 250 is etched using the resist patterns as an etch mask to thereby extend the trench 251 into the absorber layer 250.

Figure 3D:
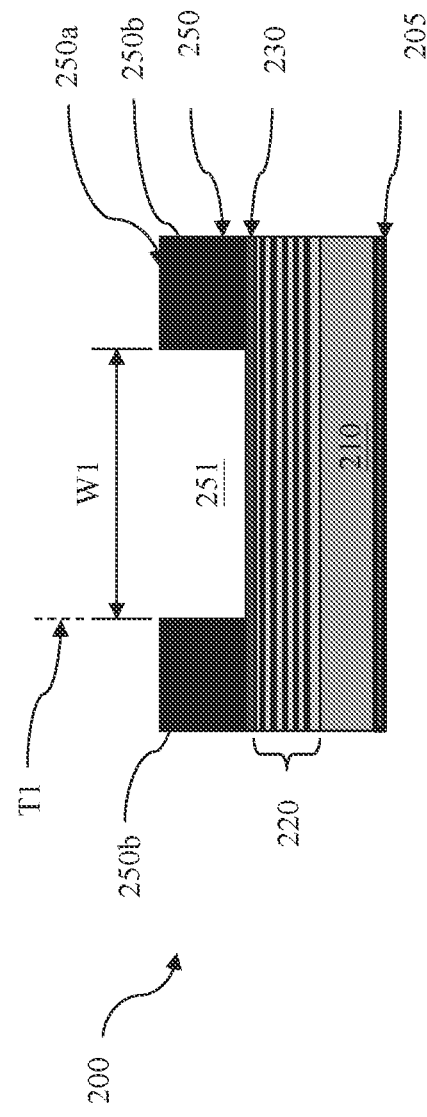

Referring to FIG. 3D, the resist pattern 260 is removed from the workpiece 200, for example, using resist stripping. As illustrated in FIG. 3D, operation 304 results in a top surface portion 250*a* of the absorber layer 250 being patterned to create a trench 251 having a first width W1 and first and second sidewalls 250*b* each having a first thickness T1. The first thickness T1 actually has zero value and serves only as a reference line for later comparison. The EUVL mask 200 in FIG. 3D corresponds to the EUVL mask 108 in FIG. 1B. In one or more embodiments, as illustrated in FIG. 1C, the trench 251 may be part of a circuit pattern 240 that corresponds to one layer in an IC die. The layer may include active regions, gate structures, vias, metal structures, or other suitable circuit features.

At operation 306, the method 300 (FIG. 2A) may optionally pattern the absorber layer 250, the capping layer 230, and the reflective ML 220 to form trenches 254 corresponding to a die boundary area. This includes a variety of processes including coating a photoresist layer over the workpiece 200, exposing the photoresist layer, developing the photoresist layer to form photoresist patterns, etching the various layers 250, 230, and 220 using the photoresist patterns as an etch mask, and removing the photoresist patterns. The details of the operation 306 are further described below in conjunction with FIGS. 4E-4G.

At operation 308, the EUVL mask 200 is moved to a CD measurement tool, such as a CD-SEM instrument, to measure W1. The CD-SEM is but one non-limiting example of a metrology instrument that may be used to measure a width of various features on the EUVL mask 200. Other suitable metrology instruments may be used in place of the CD-SEM. In some embodiments, W1 may be greater than 100 nm. In other embodiments, W1 may range from about 50 nm to about 100 nm.

At operation 310, the EUVL mask 200 is moved to a plasma etcher. The plasma etcher is but one non-limiting example of an etching tool that may be used to etch the EUVL mask 200. Other suitable etching tools may be used in place of the plasma etcher. A pump is operated to remove gas from the plasma etcher in order to create a vacuum pressure of about 2 to about 10 mtorr. In some embodiments, the vacuum pressure may be less than 2 mtorr. In other embodiments, the vacuum pressure may be less than 1 mtorr.

At operation 312, the EUVL mask 200 is treated with O2 plasma 280 in the plasma etcher to enhance oxide layer growth on the absorber layer 250 and to lower a CD of the trench 251. In some embodiments, a CD mean to target (MtT) may be about 1.0-1.4 nm prior to the operation 312. In some embodiments, the CD may be lowered by about 0.6 to about 0.9 nm by the operation 312. In some embodiments, the lowering of the CD by the operation 410 may exceed a planned lowering of the CD by a pre-offset distance of about 0.2 to about 0.3 nm.

The lowering of the CD by O2 plasma treatment 280 may be global process affecting all patterns on the EUVL mask 200. In a global process, the O2 plasma treatment 280 will not change a CD uniformity or a proximity trend. In other embodiments, the O2 plasma treatment 280 may be a local process in which the O2 plasma 280 is applied using a plasma beam or plasma spot enabling targeting of specific patterns on the EUVL mask 200. In the local process, by compensating at specific patterns, the O2 plasma treatment 280 can be used to control CD uniformity. Whether performing a global or local process, following each O2 plasma treatment 280, the resulting patterns can be measured and analyzed, variations detected, and the process changed to compensate. The details of the operation 312 are further illustrated in FIG. 3E.

Prior to igniting the O2 plasma, a flow of O2 may be applied using a source power of about 0 W, a bias power of about 0 W, a carrier gas flow rate of about 20-100 sccm, an O2 flow rate of about 150-250 sccm, a N2 flow rate of about 0 sccm, and for a time of about 10-60 s.

Figure 3E:
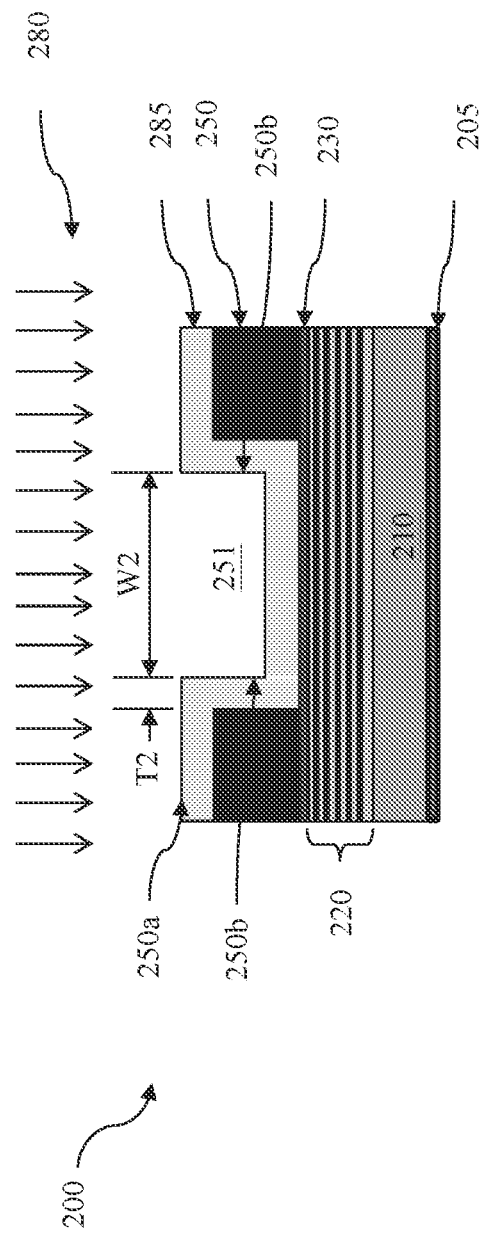

Referring to FIG. 3E, the O2 plasma 280 reacts with the absorber layer 250 to grow an oxide layer 285 on the top surface portion 250a and on the first and second sidewalls 250b. In some embodiments, the O2 plasma is applied using a source power of about 600-1000 W, a bias power of about 0 W, a carrier gas flow rate of about 20-100 sccm, an O2 flow rate of about 150-250 sccm, a N2 flow rate of about 0 sccm, and for a time of about 70-200 s. In some embodiments, the carrier gas may be helium. In some embodiments, the absorber layer 250 includes TaBN and the reaction forms TaO. TaBN is but one non-limiting example of a metal nitride included in the absorber layer 250. Other suitable metal nitrides may be used in place of TaBN, including without limitation TaN and TiN. TaO is but one non-limiting example of a metal oxide included in the absorber layer 250 as a product of the reaction. Other suitable metal oxides may be produced, including without limitation TaBO.

Resulting from the O2 plasma treatment 280 at operation 312, a thickness of each of the first and second sidewalls 250b is increased from T1 to a second thickness T2 and a width of the trench 251 is decreased from W1 to a second width W2, which corresponds to a second CD. In some embodiments, T2 may be about 0.3 to about 0.45 nm. In one non-limiting example, W1 may be about 140-160 nm and W2 may be less than W1 by about 0.6-0.9 nm. In some embodiments, a height of the top surface portion 250a may be increased by about a distance T2. In other embodiments, a height of the top surface portion 250a may be increased between about 0 nm and about a distance T2.

Therefore, as a result of the operation 312, the top surface portion 250a is moved upward, the first and second sidewalls 250b are moved toward each other, a lateral (or horizontal) dimension of the absorber layer 250 increases on each side of the trench 251 by a length T2, and the width of the trench 251 decreases by twice the length T2.

The O2 plasma 280 may also react with an exposed portion of the capping layer 230. In other words, the O2 plasma 280 may react with a portion of the capping layer 230 disposed in the trench 251. In some embodiments, the capping layer 230 includes Ru and the reaction forms RuO. Ru is but one non-limiting example of a metal included in the capping layer 230. Other suitable metals may be used in place of Ru, including without limitation RuB, RuSi, and RuN. RuO is but one non-limiting example of a metal oxide included in the capping layer 230 as a product of the reaction. Other suitable metal oxides may be produced, including without limitation RuBO. In some embodiments, oxidation of the capping layer 230 may cause damage such as by weakening protection of the reflective multilayer 220, by exposing the reflective multilayer 220, and/or by altering the reflectivity of the EUVL mask 200. A protected portion of the capping layer 230 may be disposed under the absorber layer 250 preventing the protected portion from reacting with the O2 plasma and preventing formation of a metal oxide. In other words, a portion of the capping layer 230 contacting the absorber layer 250 or disposed under the absorber layer 250 may not react with O2 plasma 280 and may not include the metal oxide. Hence, the capping layer 230 may have a non-uniform composition, where the exposed portion includes the metal oxide and the protected portion is free from the metal oxide. In some embodiments, the protected portion may have less metal oxide compared to the exposed portion.

In some embodiments, the absorber layer 250 includes tantalum, titanium, chromium, palladium, molybdenum, or other elements. Some of the elements in the absorber layer 250 may be oxidized using O2 plasma treatment. For example, the absorber layer 250 may include tantalum (Ta), tantalum boride (TaB), or tantalum boride nitride (TaBN), which may react with O2 plasma to form tantalum oxide (TaO), tantalum pentoxide ($Ta_2O_5$), or tantalum boron oxide (TaBO). Once oxidized, the lateral (or horizontal) dimension of the absorber layer 250 increases and the lateral dimension of the trench 251 decreases. This can be used to control the critical dimensions of the circuit patterns on the wafer (e.g., wafer 116). To control the oxidation, the method 300 performs operation 312 to treat the various exposed surfaces of the workpiece 200. In some embodiments, the absorber layer 250 includes a concentration gradient resulting from the oxidation reaction, wherein the top surface portion 250a and/or the first and second sidewalls 250b include a first concentration of metal oxide, a bulk portion of the absorber layer 250 includes a second concentration of metal oxide less than the first concentration, and the absorber layer 250 includes a concentration gradient of metal oxide between the top surface portion 250a and the bulk portion.

At operation 318, the EUVL mask 200 is treated with N2 plasma 290 in the plasma etcher to protect the capping layer 230 and to raise the CD of the trench 251. In some embodiments, the CD may be raised by about 0.2 to about 0.3 nm by the operation 318. In some embodiments, the raising of the CD by the operation 318 may be compensated for by the lowering of the CD by the pre-offset distance of about 0.2 to about 0.3 nm at operation 312. The details of the operation 318 are further illustrated in FIG. 3F.

Figure 3F:
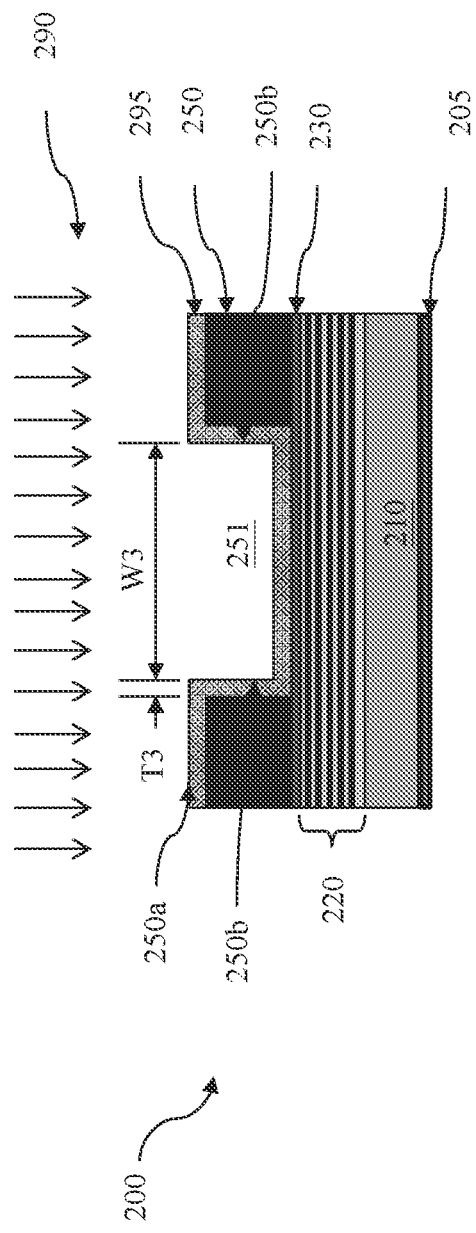

Referring to FIG. 3F, the N2 plasma 290 reacts with the oxide layer 285 formed on the top surface portion 250a, on the first and second sidewalls 250b, and on the exposed portion of the capping layer 230. In some embodiments, the N2 plasma is applied using a source power ranging from about 600 to about 1000 W, a bias power of about 0 W, a carrier gas flow rate of about 0 sccm, an O2 flow rate of about 0 sccm, a N2 flow rate of about 150-250 sccm, and for a time ranging from about 20 to about 240 s. In some embodiments, the absorber layer 250 includes TaO and the reaction forms TaBN. Resulting from the N2 plasma treatment 290 at operation 318, a thickness of each of the first and second sidewalls 250b is decreased from T2 to a third thickness T3 and a width of the trench 251 is increased from W2 to a third width W3, which corresponds to a third CD. In one or more embodiments, T3 is greater than T1. In some embodiments, T3 may be about 0.2-0.3 nm. In one non-limiting example, W3 may be about 140-160 nm. In some embodiments, a height of the top surface portion 250a may be decreased by about a distance equal to a difference between T2 and T3. In other embodiments, a height of the top surface portion 250a may be decreased between about 0 nm and about the distance equal to a difference between T2 and T3. In some embodiments, a CD MtT may be lowered by about 0.5-0.7 nm from about 1.0-1.4 nm prior to the operation 312 to about 0.3-0.9 nm after the operation 318.

Therefore as a result of the operation 318, the top surface portion 250a is moved downward, the first and second sidewalls 250b are moved away from each other, a lateral (or horizontal) dimension of the absorber layer 250 decreases on each side of the trench 251 by about a distance equal to a difference between T2 and T3, and a width of the trench 251 increases by twice the difference between T2 and T3. In some embodiments, the N2 plasma causes N atoms to insert into the grain boundary of the capping layer 230 protecting the capping layer 230 from damage due to oxidation at operation 312. To impart protection to the capping layer 230, the N2 plasma treatment 290 may include a longer duration and/or a higher source power compared to a treatment intended to clean and/or etch the absorber layer 250.

The method 300 may include additional optional steps as illustrated in FIG. 2B. For instance, after operation 312, at operation 314, the EUVL mask 200 may be moved back to the CD-SEM and W2 may be measured much like the measuring of W1 at operation 308.

At operation 316, W2 is compared to a target width to determine whether W2 is at the target width. The target width may correspond to a target CD for a circuit pattern on a wafer. If W2 is at the target width, then the method 300 skips operations 318, 320, and 322 and proceeds to operation 324, wherein the EUVL mask 200 is transferred to a subsequent process step. If W2 is above the target width, then the method 300 returns to operation 312. The details of the operation 312 are further illustrated in FIG. 3E and have been discussed with reference to FIG. 2A. If W2 is below the target width, then the method 300 proceeds to operation 318. The details of the operation 318 are further illustrated in FIG. 3F and have been discussed with reference to FIG. 2A.

At operation 320, after the treating of the EUVL mask 200 with N2 plasma 290 at operation 318, the EUVL mask 200 may be moved back to the CD-SEM and W3 may be measured much like the measuring of W2 at operation 314.

At operation 322, W3 is compared to the target width to determine whether W3 is at the target width. If W3 is at the target width, then the method 300 proceeds to operation 324, wherein the EUVL mask 200 is transferred to a subsequent process step. If W3 is above the target width, then the method 300 returns to operation 312. The details of the operation 312 are further illustrated in FIG. 3E and have been discussed with reference to FIG. 2A. If W3 is below the target width, then the method 300 returns to operation 318. The details of the operation 318 are further illustrated in FIG. 3F and have been discussed with reference to FIG. 2A. The method 300 may continue through as many operations as needed until operation 324 is reached.

It will be appreciated that each determination of whether a width of the trench 251 is at the target width will be subject to design tolerances. In some embodiments, the width of the trench 251 may be said to be at the target width even if the widths vary by up to about 0.1 nm. In other embodiments, the width of the trench 251 may satisfy a condition of being at the target width even if the widths vary by up to about 0.5 nm or up to about 1 nm.

The method 300 that has been discussed with reference to FIGS. 3A-3F may similarly apply to other embodiments of the EUVL mask 200, such as that illustrated in FIGS. 4A-4I. The following description of the method 300 as applied in various embodiments may only highlight aspects that depart from the method 300 as applied to FIGS. 3A-3F.

Figure 4A:
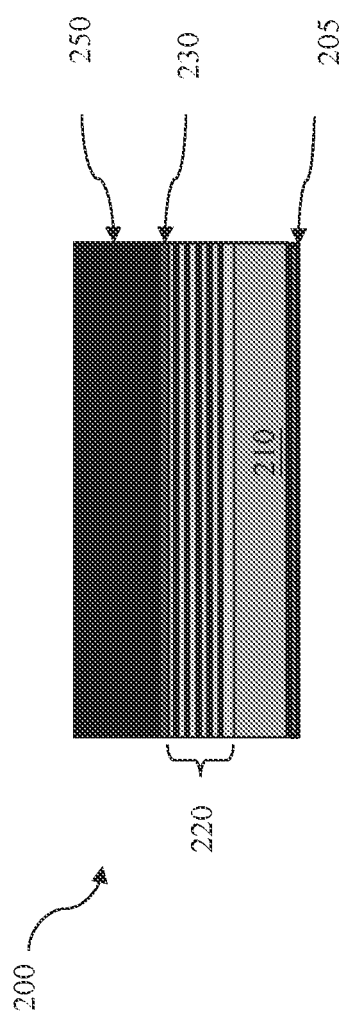
Figure 4B:
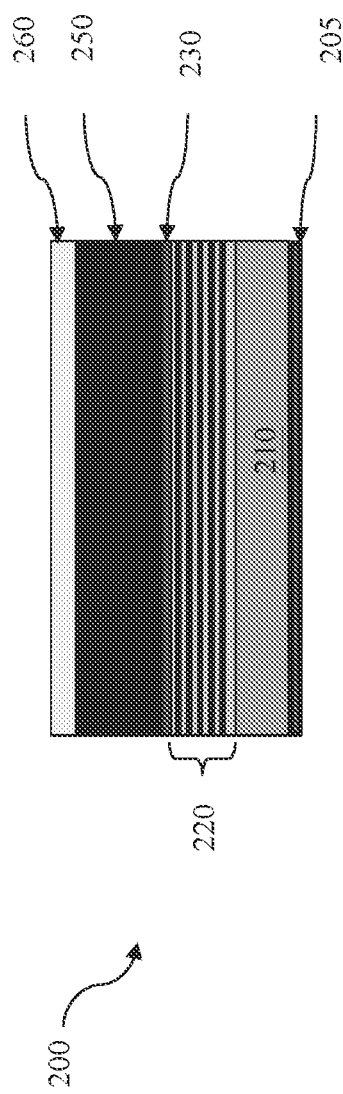
Figure 4C:
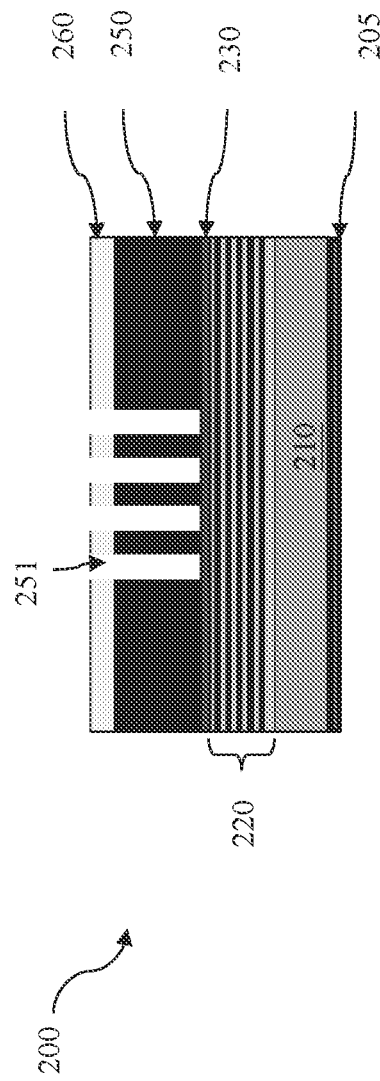
Figure 4D:
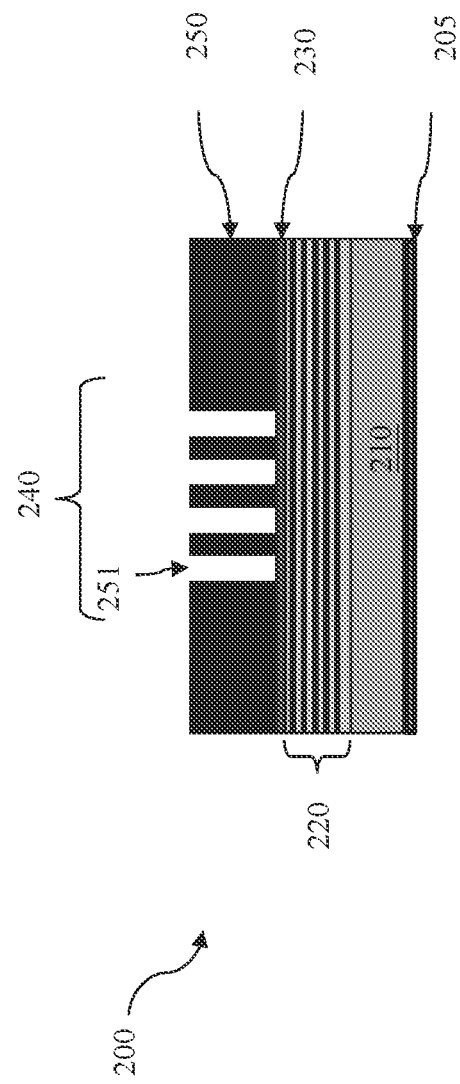

Referring to FIGS. 4A-4D, at operation 302, the method 300 (FIG. 2A) receives a workpiece 200 such as shown in FIG. 4A. At operation 304, the method 300 (FIG. 2A) patterns the absorber layer 250 to produce circuit patterns thereon. The details of operation 304 are further illustrated in FIGS. 4B-4D. In contrast to FIGS. 3B-3D, in one or more embodiments, operation 304 forms a plurality of trenches 251, as illustrated in FIG. 4D. Otherwise, the operation 304, as described with reference to FIGS. 3B-3D, likewise applies to FIGS. 4B-4D.

At operation 306, the method 300 (FIG. 2A) may optionally pattern the absorber layer 250, the capping layer 230, and the reflective ML 220 to form trenches 254 corresponding to a die boundary area. This includes a variety of processes including coating a photoresist layer over the workpiece 200, exposing the photoresist layer, developing the photoresist layer to form photoresist patterns, etching the various layers 250, 230, and 220 using the photoresist patterns as an etch mask, and removing the photoresist patterns. The details of the operation 306 are further illustrated in FIGS. 4E-4G.

Referring to FIG. 4E, another photoresist layer 270 is formed over the workpiece 200 (e.g., by spin coating), and is patterned to form openings 254 in the photoresist layer 270. The photoresist layer 270 is sensitive to electron beams in the present embodiment. The photoresist layer 270 may be a positive photoresist or a negative photoresist. Patterning the photoresist layer 270 includes exposing the photoresist layer 270 to a patterned electron beam and developing the photoresist layer 270 in a suitable developer. In the present embodiment, the trenches 254 correspond to areas of a wafer between IC dies, which are referred to as die boundary area in the present disclosure. In other words, the trenches 254 do not correspond to circuit patterns, but rather surround circuit patterns.

Referring to FIG. 4F, in this example, the absorber layer 250, the capping layer 230, and the reflective ML 220 are etched using the patterned photoresist layer 270 as an etch mask, thereby extending the trenches 254 into the workpiece 200. The trenches 254 expose the top surface of the substrate 210. In some embodiments, the trenches 254 help reduce or eliminate field-to-field interference during wafer imaging.

Figure 4G:
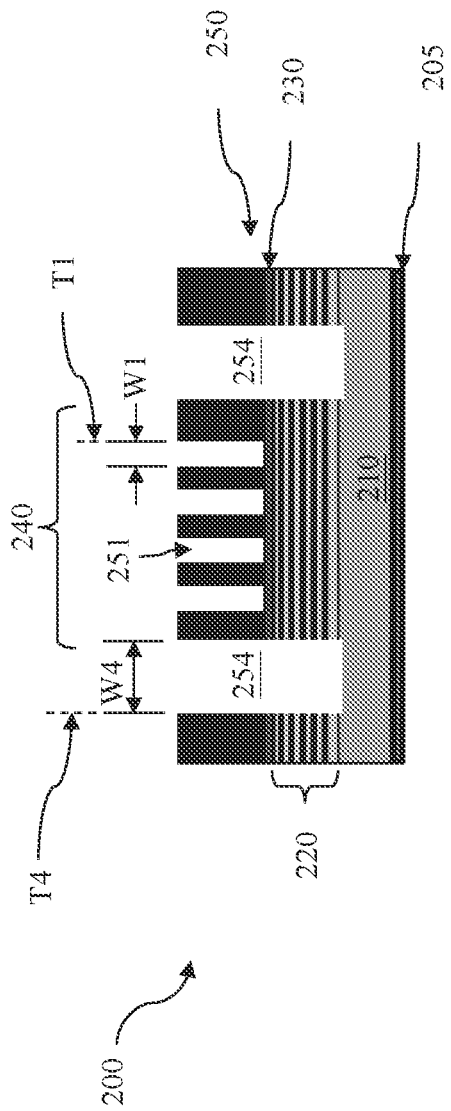

Referring to FIG. 4G, the patterned photoresist layer 270 is removed, for example, by resist stripping. That leaves the patterned layers 220, 230, and 250 over the substrate 210. Particularly, the patterned layers 220, 230, and 250 provide the trenches 251 and 254. The trenches 251 and the patterned absorber layer 250 correspond to the circuit pattern 240. The trenches 254 correspond to a die boundary area. Through the trenches 251 and 254, various surfaces of the layers 220, 230, and 250 are exposed. Particularly, various surfaces of the absorber layer 250 are exposed. After the patterning by operation 304 or 306, the workpiece 200 provides an EUVL mask, such as the EUVL mask 108 or the EUVL mask 200. The EUVL mask includes the substrate 210 and the patterned layers 220, 230, and/or 250.

Referring still to FIG. 2A, the patterned EUVL mask 200 according to FIG. 4G has circuit pattern trenches 251 and die boundary trenches 254. After operations 304 and 306, the trenches 251 have a first width W1 and first sidewall thickness T1 as in other embodiments. However, the die boundary trenches 254 have a first width W4 and a first thickness T4.

Figure 4H:
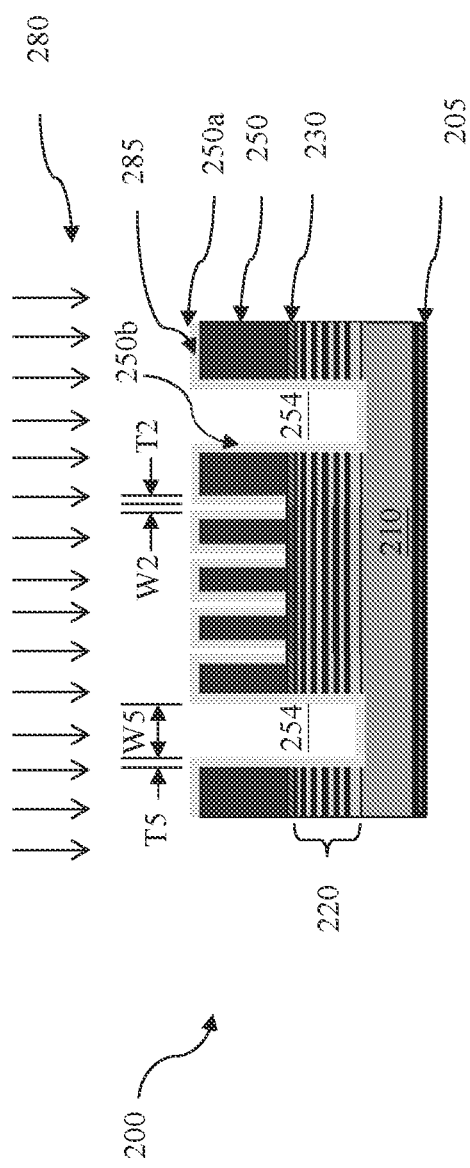
Figure 4I:
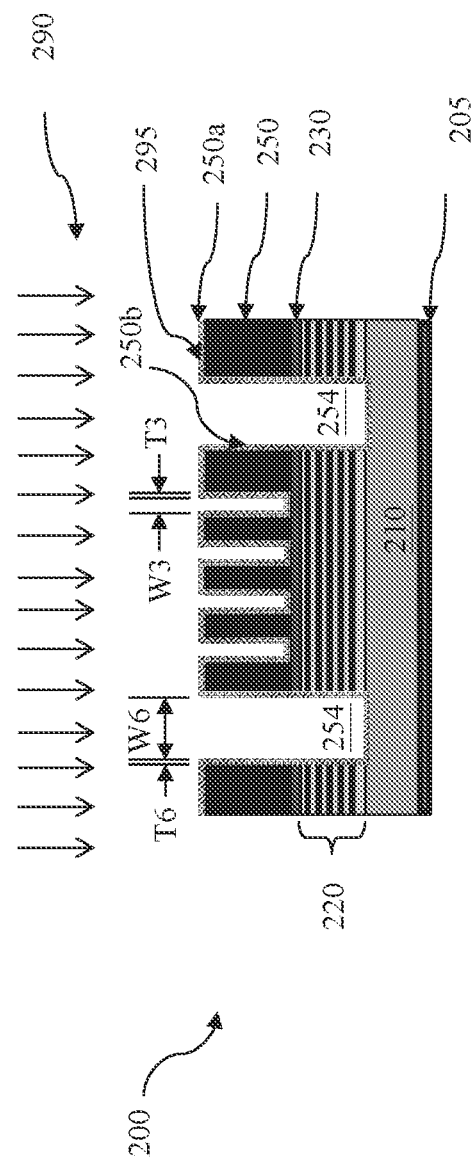

At operation 308, in addition to measuring W1, W4 may also be measured. At operation 312, the treating of the EUVL mask with O2 plasma increases a thickness of the first and second sidewalls 250b of the trenches 254 from T4 to a second thickness T5 and decreases a width of the trenches 254 from W4 to a second width W5, as illustrated in FIG. 4H. At operation 318, the treating of the EUVL mask with N2 plasma decreases a thickness of the first and second sidewalls 250b of the trenches 254 from T5 to a third thickness T6 and increases a width of the trenches 254 from W5 to a third width W6, as illustrated in FIG. 4I.

Referring to FIG. 2B, at operation 314, in addition to measuring W2, W5 may be measured for one or more of the trenches 254. At operation 316, W5 of the one or more of the trenches 254 may be compared to a target width for the one or more of the trenches 254 to determine whether W5 is at the target width. At operation 320, W6 may be measured for the one or more of the trenches 254. At operation 322, W6 of the one or more of the trenches 254 may be compared to a target width for the one or more of the trenches 254 to determine whether W6 is at the target width.

Figure 5:
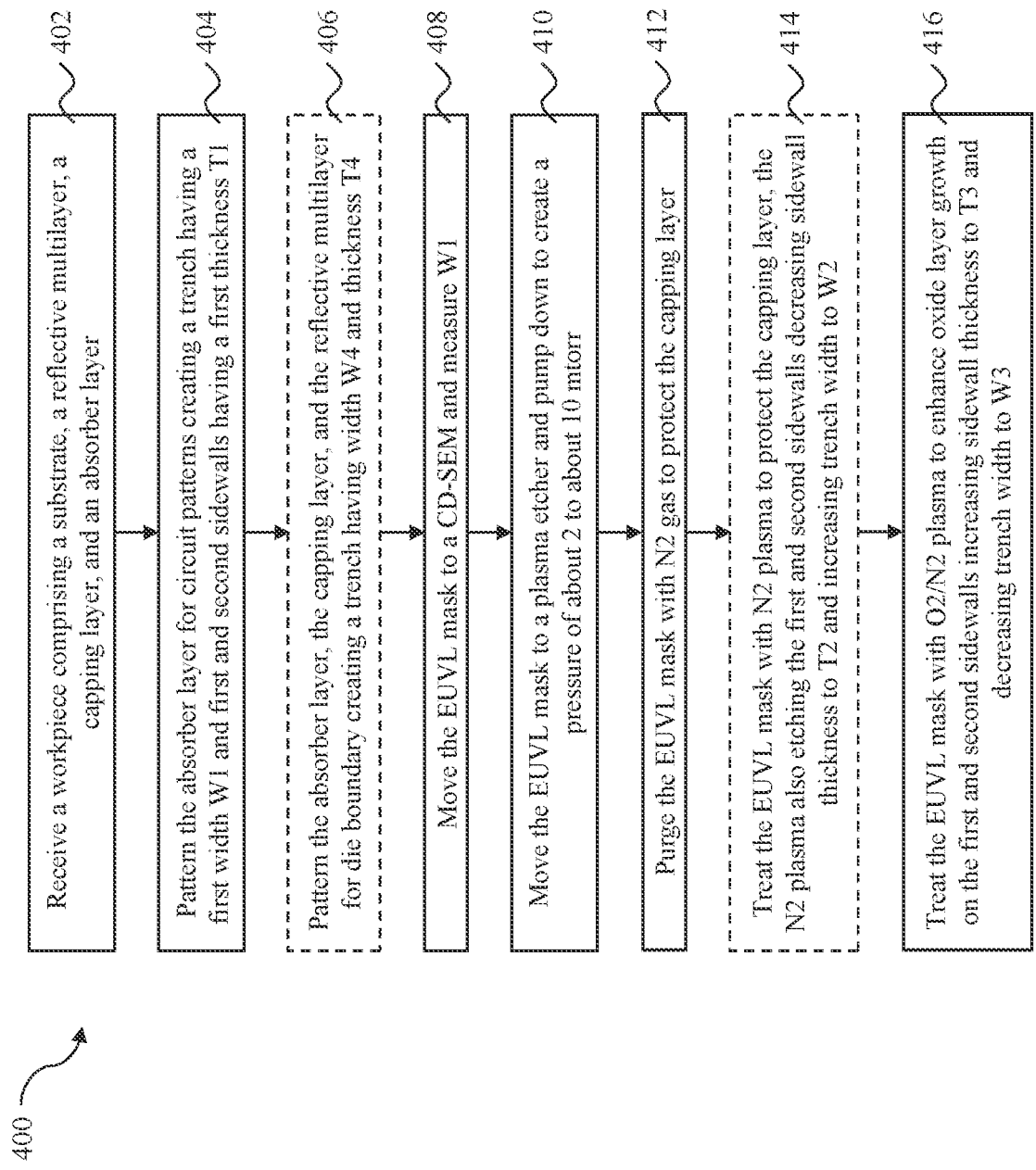
FIG. 5 shows a flowchart of a method of making EUVL masks according to various aspects of the present disclosure.

FIG. 5 shows a flow chart of a method 400 of making EUVL masks, such as the EUVL mask 200, in accordance with an embodiment. The method 400 is merely an example and is not intended to limit the present disclosure beyond what is explicitly recited in the claims. Additional operations can be provided before, during, and after the method 400, and some operations described can be replaced, eliminated, or moved around for additional embodiments of the method.

The details of the operations 402, 404, 406, 408, and 410, further illustrated in FIGS. 6A-6D, are the same as operations 302, 304, 306, 308, and 310 of method 300, respectively. The details of the operations 302, 304, 306, 308, and 310 are further illustrated in FIGS. 3A-3D and FIGS. 4A-4G and have been discussed with reference to FIG. 2A.

At operation 412, the EUVL mask 200 is purged with N2 gas 292 in the plasma etcher to protect the capping layer 230. The details of the operation 412 are further illustrated in FIG. 6E.

Figure 6A:
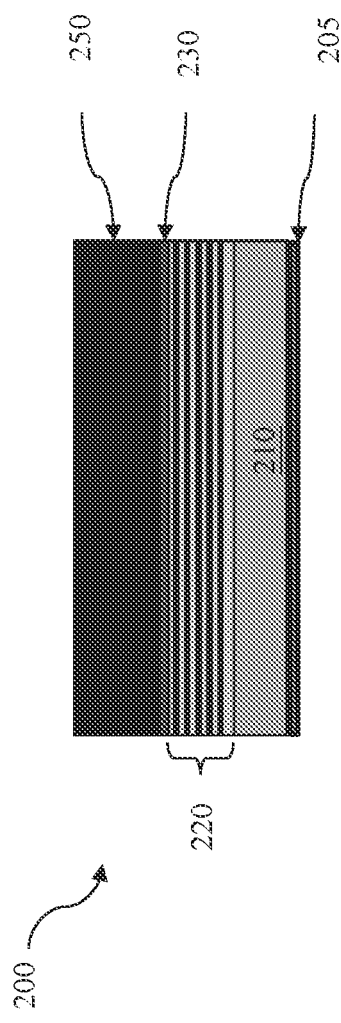
Figure 6B:
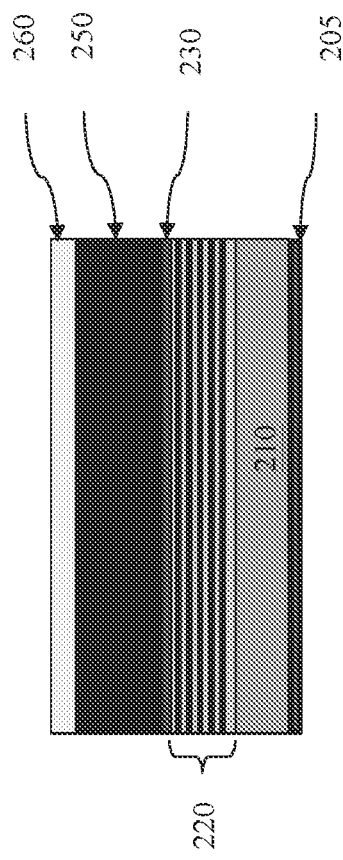
Figure 6E:
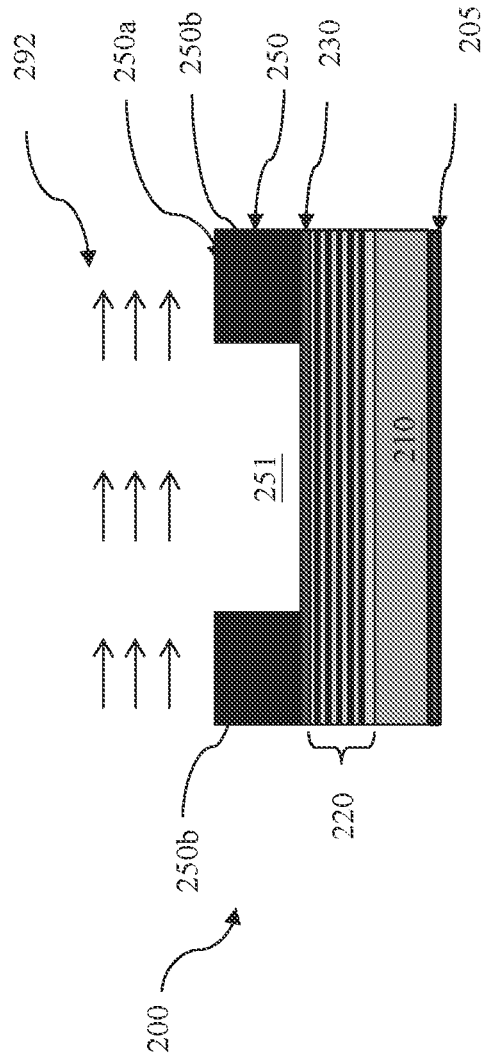

Referring to FIG. 6E, the N2 gas purge 292 absorbs N atoms on the top surface portion 250a, on the first and second sidewalls 250b, and on the exposed portion of the capping layer 230. In some embodiments, the N2 gas purge 292 is applied using a source power of about 0 W, a bias power of about 0 W, a pressure of about 10-50 mtorr, an O2 flow rate of about 0 sccm, a N2 flow rate of about 50-150 sccm, and for a time of about 30-90 s. In some embodiments, the N2 gas purge causes N atoms to insert into the grain boundary of the capping layer 230 protecting the capping layer 230 from damage due to oxidation.

At operation 414, the EUVL mask 200 may optionally be treated with N2 plasma 290 in the plasma etcher to protect the capping layer 230 and raise the CD of the trench 251. The details of the operation 414 are further illustrated in FIG. 6F.

Figure 6F:
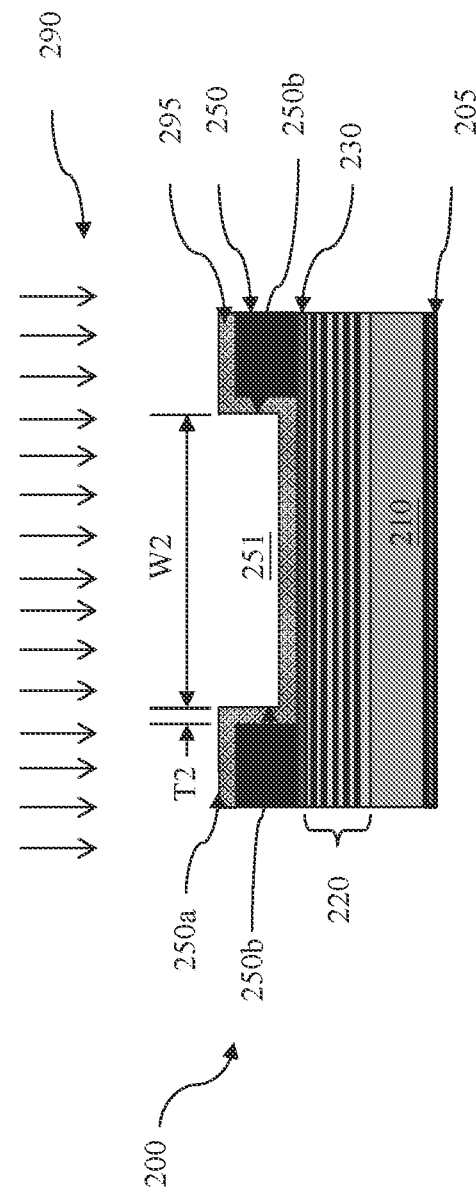

Referring to FIG. 6F, the N2 plasma 290 reacts with the top surface portion 250a, the first and second sidewalls 250b, and the exposed portion of the capping layer 230. In some embodiments, the N2 plasma is applied using a source power ranging from about 600 to about 1000 W, a bias power of about 0 W, a carrier gas flow rate of about 0 sccm, an O2 flow rate of about 0 sccm, a N2 flow rate of about 150-250 sccm, and for a time ranging from about 20 to about 240 s. In some embodiments, the absorber layer 250 includes TaO and the reaction forms TaBN. In some embodiments, the N2 plasma causes N atoms to insert into the grain boundary of the capping layer 230 protecting the capping layer 230 from damage due to oxidation.

Resulting from the N2 plasma treatment 290 at operation 414, a thickness of each of the first and second sidewalls 250b is decreased from a first thickness T1 to a second thickness T2 and a width of the trench 251 is increased from a first width W1 to a second width W2. In some embodiments, T2 may range from about 0.2 to about 0.3 nm. In some embodiments, a height of the top surface portion 250a may be decreased by about a distance T2. In other embodiments, a height of the top surface portion 250a may be decreased between about 0 nm and about the distance T2.

Therefore, as a result of the operation 414, the top surface portion 250a is moved downward, the first and second sidewalls 250b are moved away from each other, a lateral (or horizontal) dimension of the absorber layer 250 decreases on each side of the trench 251 by a length T2, and a width of the trench 251 increases by twice the length T2.

Although operations 412 and 414 are described only in the context of the method 400, it will be appreciated that in some embodiments, these operations may be performed before operation 312 of the method 300.

At operation 416, the EUVL mask 200 is treated with O2/N2 plasma 282 in the plasma etcher to enhance oxide layer growth on the absorber layer 250 and to lower a CD of the trench 251. In some embodiments the CD may be lowered by about 0 to about 0.01 nm by the operation 416. In other embodiments, the CD may be lowered by about 0.01-0.15 nm by the operation 416. In other embodiments, the CD may be lowered by about 0.15-0.2 nm by the operation 416. In other embodiments, the CD may be lowered by about 0.2-0.26 nm by the operation 416. The details of the operation 416 are further illustrated in FIG. 6G.

Referring to FIG. 6G, the O2/N2 plasma 282 reacts with the absorber layer 250 to grow an oxide layer 285 on the top surface portion 250a and on the first and second sidewalls 250b. In some embodiments, the absorber layer 250 includes TaBN and the reaction forms TaO. In various embodiments, the O2/N2 plasma may be applied using a source power of about 600-1000 W, a bias power of about 0 W, a pressure of about 8-30 mtorr, an O2 flow rate of about 20-80 sccm, an N2 flow rate of about 20-80 sccm, and for a time of about 30-90 s. In a first non-limiting example, the O2/N2 plasma 282 may be applied using a source power of about 600 W, a bias power of about 0 W, a pressure of about 8 mtorr, an O2 flow rate of about 50 sccm, a N2 flow rate of about 50 sccm (volumetric ratio of O2:N2=1:1), and for a time of about 30 s. In a second non-limiting example, the O2/N2 plasma 282 may be applied using a source power of about 600 W, a bias power of about 0 W, a pressure of about 8 mtorr, an O2 flow rate of about 80 sccm, an N2 flow rate of about 20 sccm (volumetric ratio of O2: N2=4:1), and for a time of about 30 s. In a third non-limiting example, the O2/N2 plasma 282 may be applied using a source power of about 1000 W, a bias power of about 0 W, a pressure of about 8 mtorr, an O2 flow rate of about 80 sccm, an N2 flow rate of about 20 sccm (O2: N2=4:1), and for a time of about 30 s. In a fourth non-limiting example, the O2/N2 plasma 282 may be applied using a source power of about 1000 W, a bias power of about 0 W, a pressure of about 8 mtorr, an O2 flow rate of about 80 sccm, an N2 flow rate of about 20 sccm (O2:N2=4:1), and for a time of about 60 s. In various embodiments, the O2/N2 plasma 282, according to the fourth non-limiting example, may be applied for a time ranging from about 30 s to about 90 s. It will be appreciated that the CD can be controlled by changing one of the O2: N2 ratio, the source power applied, and the duration of the O2/N2 plasma treatment 282.

Prior to igniting the O2/N2 plasma 282, a flow of O2/N2 may be applied using a source power of about 0 W, a bias power of about 0 W, a pressure of about 10-50 mtorr, and for a time of about 10-60 s. The O2 and N2 flow rates prior to ignition will match the O2 and N2 flow rates for each respective O2/N2 plasma treatment 282.

Resulting from the O2/N2 plasma treatment 282 at operation 416, a thickness of each of the first and second sidewalls 250b is increased from T2 to a third thickness T3 and a width of the trench 251 is decreased from W2 to a third width W3. In some embodiments, T3 may be about 0.5-0.7 nm. In some embodiments, a height of the top surface portion 250a may be increased by about a distance equal to a difference between T2 and T3. In other embodiments, a height of the top surface portion 250a may be increased between about 0 nm and about the distance equal to the difference between T2 and T3.

Therefore, as a result of the operation 416, the top surface portion 250a is moved upward, the first and second sidewalls 250b are moved toward each other, a lateral (or horizontal) dimension of the absorber layer 250 increases on each side of the trench 251 by a length equal to a difference between T2 and T3, and the width of the trench 251 decreases by twice the difference between T2 and T3. The O2/N2 plasma 282 also reacts with an exposed portion of the capping layer 230. In some embodiments, the capping layer 230 includes Ru and the reaction forms RuO. In some embodiments, the capping layer may be protected from damage due to oxidation at operation 416 by the N2 gas purge 292 at operation 412, by the pre-treatment with N2 plasma 290 at operation 414, and/or by the O2/N2 plasma treatment 282 itself at operation 416.

In some embodiments, the absorber layer 250 includes tantalum, titanium, chromium, palladium, molybdenum, or other elements. Some of the elements in the absorber layer 250 may be oxidized using O2/N2 plasma treatment. For example, the absorber layer 250 may include tantalum (Ta), tantalum boride (TaB), or tantalum boride nitride (TaBN), which may react with O2/N2 plasma to form tantalum oxide (TaO), tantalum pentoxide ($Ta_2O_5$), or tantalum boron oxide (TaBO). Once oxidized, the lateral (or horizontal) dimension of the absorber layer 250 increases and the lateral dimension of the trench 251 decreases. This can be used to control the critical dimensions of the circuit patterns on the wafer (e.g., wafer 116). To control the oxidation, the method 400 performs operation 416 to treat the various exposed surfaces of the workpiece 200. In some embodiments, the absorber layer 250 includes a concentration gradient resulting from the oxidation reaction, wherein the top surface portion 250a and/or the first and second sidewalls 250b include a first concentration of metal oxide, a bulk portion of the absorber layer 250 includes a second concentration of metal oxide less than the first concentration, and the absorber layer 250 includes a concentration gradient of metal oxide between the top surface portion 250a and the bulk portion.

The method 400 may include additional optional operations from method 300 such as those illustrated in FIG. 2B. Specifically, after operation 414, W2 may be measured in the CD-SEM and compared to a target width to determine whether W2 is at the target width. Likewise, after operation 416, W3 may be measured in the CD-SEM and compared to the target width to determine whether W3 is at the target width. After each comparison, the EUVL mask 200 may be further processed using an additional N2 plasma treatment 290 at operation 414 or an additional O2/N2 plasma treatment 282 at operation 416 depending on a result of the comparison.

In some embodiments, the methods 300, 400 are applied in a mask shop during manufacturing of the EUVL masks 108, 200. In other embodiments, various steps of the methods 300, 400 may be applied during cleaning, wafer fabrication, or use of the EUVL masks 108, 200. In one non-limiting example, a width of the trench 251 may be measured during a cleaning or wafer fabrication step and compared to the target width. If the width of the trench 251 is no longer at the target width, then the EUVL mask 200 may be transferred back to the mask shop for carrying out additional operations of the methods 300, 400 to bring the EUVL mask 200 within specifications for the target width corresponding to a target CD for a circuit pattern on a wafer.

According to some embodiments, one of the O2 plasma treatment 280, the O2/N2 plasma treatment 282, and the N2 plasma treatment 290 of the methods 300, 400 may alter a surface property of the absorber layer 250. In some aspects, one of the plasma treatments 280, 282, 290 may remove surface contamination, for example carbon. In other aspects, one of the plasma treatments 280, 282, 290 may increase a hydrophilicity of a treated surface of the absorber layer 250 or another exposed layer 210, 220, 230 of the EUVL mask 200. Increasing the hydrophilicity may lower a contact angle of a cleaning solution on a treated surface of the EUVL mask 200. In this way, increasing the hydrophilicity may improve a particle removal rate during mask cleaning.

The present disclosure provides for many different embodiments. In one embodiment, a method is provided. The method includes fabricating a mask for extreme ultraviolet lithography (EUVL), including receiving an EUVL mask that includes a substrate having a low temperature expansion material, a reflective multilayer over the substrate, a capping layer over the reflective multilayer, and an absorber layer over the capping layer; patterning the absorber layer to form a trench on the EUVL mask, wherein the trench has a first width above a target width, wherein the target width corresponds to a critical dimension on the wafer, and wherein the trench has first and second sidewalls; treating the EUVL mask with oxygen plasma to reduce the trench to a second width by enhancing oxide layer growth on the first and second sidewalls, wherein the second width is below the target width; and treating the EUVL mask with nitrogen plasma to protect the capping layer, wherein the treating of the EUVL mask with the nitrogen plasma expands the trench to a third width by etching the first and second sidewalls, wherein the third width is at the target width.

In another embodiment, a mask is provided. The mask includes an extreme ultraviolet lithography (EUVL) mask for patterning a semiconductor wafer, including a substrate having a low temperature expansion material; a reflective multilayer over the substrate; a capping layer over the reflective multilayer; and an absorber layer over the capping layer, wherein the absorber layer includes a metal nitride, wherein a trench formed in the absorber layer has first and second sidewalls, wherein the first and second sidewalls include a metal oxide, and wherein the metal nitride and the metal oxide each include a first metal.

In some embodiments, the method includes patterning a semiconductor wafer using lithography, including loading a mask to a lithography tool, wherein the mask includes: a substrate having a low temperature expansion material; a reflective multilayer over the substrate; a capping layer over the reflective multilayer; and an absorber layer over the capping layer, wherein the absorber layer includes a metal nitride, wherein a trench formed in the absorber layer has first and second sidewalls, wherein the first and second sidewalls include a metal oxide, and wherein the metal nitride and the metal oxide each include a first metal; loading the wafer to the lithography tool; and performing an exposure process to the wafer using the mask.

In some embodiments, the method includes fabricating a mask used in extreme ultraviolet lithography (EUVL), including receiving the mask that includes a substrate having a low temperature expansion material, a reflective multilayer over the substrate, a capping layer over the reflective multilayer, and an absorber layer over the capping layer; first patterning the absorber layer to form a trench on the mask, wherein the trench has a first width greater than a target width, and wherein the target width corresponds to a critical dimension on a wafer; second treating the mask with oxygen plasma to reduce the trench to a second width; third measuring the second width; and based on the measurement of the second width, fourth performing one of: if the second width is below the target width, treating the mask with nitrogen plasma to expand the trench to a third width; and if the second width is above the target width, treating the mask with oxygen plasma to reduce the trench to a fourth width. In some embodiments, the second width is below the target width. In some embodiments, the method includes fourth treating the mask with nitrogen plasma to expand the trench to the third width; fifth measuring the third width; and based on the measurement of the third width, sixth performing one of: if the third width is below the target width, treating the mask with nitrogen plasma to expand the trench to a fifth width; and if the third width is above the target width, treating the mask with oxygen plasma to reduce the trench to a sixth width. In some embodiments, the method includes after the treating of the EUVL mask with the oxygen plasma, moving the EUVL mask to a metrology instrument; and measuring the second width using the metrology instrument. In some embodiments, the method includes after the treating of the EUVL mask with the nitrogen plasma, moving the EUVL mask to a metrology instrument; and measuring the third width using the metrology instrument.

In some embodiments, the method includes patterning a semiconductor wafer using extreme ultraviolet lithography (EUVL), including receiving an EUVL mask that includes a substrate having a low temperature expansion material, a reflective multilayer over the substrate, a capping layer over the reflective multilayer, and an absorber layer over the capping layer; patterning the absorber layer to form a trench on the EUVL mask, wherein the trench has a first width greater than a target width, wherein the target width corresponds to a critical dimension on the wafer, and wherein the trench has first and second sidewalls; purging the EUVL mask with nitrogen gas to protect the capping layer; treating the EUVL mask with oxygen/nitrogen plasma to reduce the trench to a third width by enhancing oxide layer growth on the first and second sidewalls, wherein the third width is at the target width; and patterning the wafer using the EUVL mask, wherein the patterned wafer includes the critical dimension corresponding to the target width. In some embodiments, the method includes after the purging of the EUVL mask with the nitrogen gas and before the treating of the EUVL mask with the oxygen/nitrogen plasma, treating the EUVL mask with nitrogen plasma to protect the capping layer, wherein the treating of the EUVL mask with the nitrogen plasma expands the trench to a second width by etching the first and second sidewalls. In some embodiments, the oxygen/nitrogen plasma has a volumetric ratio of oxygen/nitrogen of about 1:1. In some embodiments, the oxygen/nitrogen plasma has a volumetric ratio of oxygen/nitrogen of about 4:1. In some embodiments, the purging of the EUVL mask with the nitrogen gas protects the capping layer by inserting nitrogen atoms into the grain boundary of the capping layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a mask that includes a substrate and a first layer over the substrate;
   forming a first trench within the first layer, wherein the first trench has a first width;
   forming a second trench within the first layer, wherein the second trench has a second width that is different than the first width;
   treating the mask with a first gas to modify the first trench and the second trench, the modified first trench having a third width that is different than the first width and the modified second trench having a fourth width that is different than the second width; and
   treating the mask with a second gas to modify the modified first trench to have a fifth width that is different than the third width and to modify the modified second trench to a sixth width that is different than the fourth width, the second gas being different than the first gas.

2. The method of claim 1 wherein the mask includes a second layer between the substrate and the first layer, the method further comprising:
   purging at least a portion of the second layer with nitrogen prior to the treating of the mask to expand the trench to the second width.

3. The method of claim 2, wherein the purging the portion of the second layer with nitrogen includes applying nitrogen gas at a first flow rate and wherein the treating of the mask with nitrogen to expand the trench to the second width includes applying nitrogen gas at a second flow rate that is different than the first flow rate.

4. The method of claim 3, wherein the first flow rate is about 50 sccm to about 150 sccm and the second flow rate is about 150 sccm to about 250 sccm.

5. The method of claim 1, wherein the treating of the mask with the at least one of oxygen and nitrogen to modify the trench to the third width includes treating the mask with both oxygen and nitrogen.

6. The method of claim 1, wherein the treating of the mask with both oxygen and nitrogen includes applying oxygen gas at a first flow rate and nitrogen gas at a second flow rate that is different than the first flow rate.

7. The method of claim 1, wherein the treating of the mask with both oxygen and nitrogen includes applying oxygen gas at a first flow rate and nitrogen gas at a second flow rate that is the same as the first flow rate.

8. A mask for patterning a semiconductor wafer, the mask comprising:
  a substrate;
  a first layer disposed over the substrate;
  a second layer disposed over the first layer; and
  a third layer disposed on and interfacing with the second layer, wherein the third layer includes a first metal oxide having a first concentration at an interface between the second layer and the third layer and a second concentration at an upper surface of the third layer, the second concentration being different than the first concentration.

9. The mask of claim 8, wherein the third layer is an absorber layer that includes nitrogen.

10. The mask of claim 8, wherein the third layer includes a top edge facing away from the substrate and a sidewall edge, and
  wherein the upper surface of the third layer includes a portion of the top edge and the sidewall edge of the third layer.

11. The mask of claim 8, wherein the first metal oxide includes a first metal selected from the group consisting of tantalum, aluminum, chromium, titanium, copper, nickel, hafnium palladium and molybdenum.

12. The mask of claim 11, wherein the second layer is a capping layer that includes a second metal that is different than the first metal.

13. The mask of claim 12, wherein the second metal is ruthenium.

14. The mask of claim 8, wherein the first concentration of the first metal oxide is less than the second concentration of the first metal oxide.

15. The mask of claim 8, wherein the mask is an extreme ultraviolet lithography mask.

16. A method comprising:
  receiving a mask that includes a first layer;
  forming a trench within the first layer, wherein the trench has a first width;
  treating the mask with a first gas to modify the trench to have a second width that is different than the first width; and
  treating the mask with a second gas to modify the trench to have a third width that is different than the second width, the second gas being different than the first gas.

17. The method of claim 16, wherein one of the first and second gases includes oxygen and the other of first and second gases includes nitrogen.

18. The method of claim 16, wherein the second width is less than the first width.

19. The method of claim 16, wherein the second width is greater than the first width.

20. The method of claim 16 wherein the mask further comprises a second layer under the first layer, the method further comprising:
  purging a portion of the second layer with one of the first and second gases prior to the treating of the mask with the first gas to modify the trench to have the second width that is different than the first width.

* * * * *